United States Patent [19]
Zou et al.

[11] Patent Number: 6,002,567
[45] Date of Patent: Dec. 14, 1999

[54] ESD PROTECTION FOR HIGH VOLTAGE LEVEL INPUT FOR ANALOG APPLICATION

[75] Inventors: ZhiYuan Zou; Hoang P. Nguyen, both of Fort Collins, Colo.

[73] Assignee: LSI Logic Corporation, Milpitas, Calif.

[21] Appl. No.: 08/953,184

[22] Filed: Oct. 17, 1997

[51] Int. Cl.⁶ .................................................. H02H 3/22
[52] U.S. Cl. ............................................. 361/111; 361/56
[58] Field of Search .................................. 361/56, 58, 91, 361/94, 111, 89, 212; 257/355, 356, 360, 361

[56] References Cited

U.S. PATENT DOCUMENTS

| | | | |
|---|---|---|---|
| 4,890,187 | 12/1989 | Tailliet et al. | 361/111 |
| 5,430,602 | 7/1995 | Chin et al. | 361/212 |
| 5,463,239 | 10/1995 | Muhlemann | 257/355 |
| 5,502,328 | 3/1996 | Chen et al. | 257/546 |
| 5,517,051 | 5/1996 | Chatterjee | 257/360 |
| 5,528,188 | 6/1996 | Au et al. | 327/310 |
| 5,652,455 | 7/1997 | Zambrano | 257/360 |
| 5,686,751 | 11/1997 | Wu | 257/356 |

*Primary Examiner*—Jeffrey Gaffin
*Assistant Examiner*—Kim Huynh

[57] ABSTRACT

The present invention provides for ESD protection while allowing the use of an input signal that is higher than $V_{DD}$. The present invention preferably includes a protection device and a delay circuit coupled to an input pad and to a ground reference. The protection device is a preferred silicon controlled rectifier, and the delay circuit is preferably a low pass filter RC circuit that includes a resistor and a capacitor. A node associated with the delay circuit is coupled to circuitry of an integrated circuit. The circuitry has associated therewith at least one gate oxide breakdown voltage. A gate oxide breakdown voltage is prevented from being applied to the circuitry of the integrated circuit. When an ESD voltage is applied to the input pad, the voltage at that pad ramps or increases quickly. The delay circuit prevents the node from ramping as quickly by delaying the ramping or increasing of the node voltage. This delay provides time for the protection device to turn on and sink the ESD current.

14 Claims, 15 Drawing Sheets

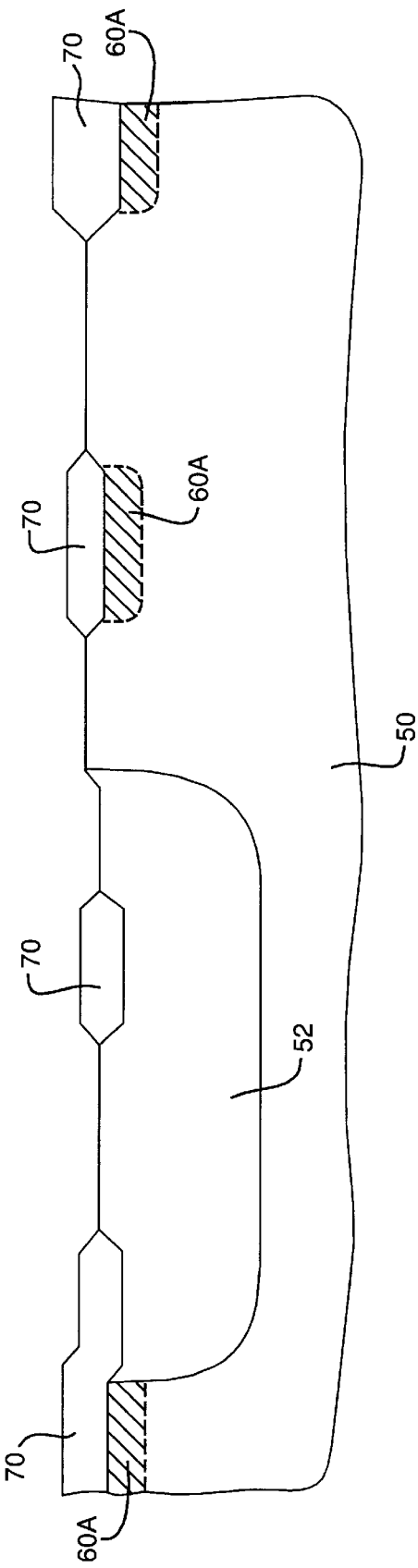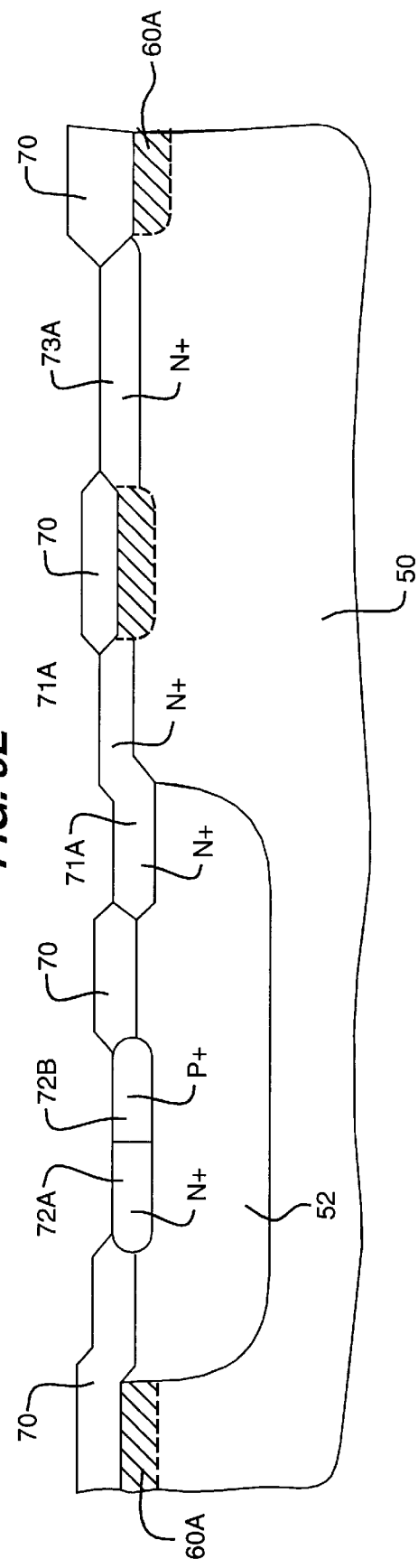

6,002,567

ESD PROTECTION FOR HIGH VOLTAGE LEVEL INPUT FOR ANALOG APPLICATION

FIELD OF THE INVENTION

The present invention relates to integrated circuits and more particularly to electrostatic discharge protection for circuitry of an integrated circuit.

BACKGROUND OF THE INVENTION

Electrostatic discharge (ESD) phenomena commonly result from pulses of high voltage (typically, several kilovolts), moderate current (a few amperes) and short duration (on the order of 100 nanoseconds) generated by a variety of sources such as human bodies, electric fields generated by machinery, and the like. Several analytical models have been developed to approximate these phenomena, including: 1) the Human Body Model (described in more detail in MIL-STD 883C method 3015.7, hereby incorporated by reference), which is typical of ESD resulting from the movement of a human body during, e.g., handling of the device; 2) the Machine Model, which characterizes ESD resulting from charges developed in automated assembly areas; and 3) the Charged Device Model, which approximates ESD from manufacturing and handling devices.

ESD effects are a common problem in integrated circuit (IC) electronics and are particularly troublesome in complimentary metal oxide semiconductor (CMOS) devices which have particularly thin gate oxides and very short channel devices. Such structures typically can withstand only a few tens of volts, but is decreasing as CMOS processes become smaller. An ESD pulse conducted through a CMOS IC can induce oxide rupture and device or interconnect burnout, and have potentially disastrous consequences.

ESD problems can be minimized by including appropriate anti-static protection on the circuit boards on which the ICs are installed; however, the ICs still are susceptible to ESD before and during the circuit board fabrication process. A general personnel awareness of ESD problems and counter-measures such as electrically grounded bracelets and the like can minimize risks in this phase of the IC life span; however, it is at best a partial solution. Therefore, it is desirable to include ESD protection circuitry within the IC itself.

Diodes have been used to shunt the ESD current to ground. This approach has its drawbacks, however, since such diodes typically have a significant parasitic series resistance which limits the amount of Current that may be shunted. Furthermore, the forward current increases with temperature due to the increased saturation current and due to the reduced semiconductor band gap. Thus, heating that results from an ESD event further limits current carrying capability. Large area diodes may be used to reduce this resistance; however, this variation reduces the chip density and increases the input circuit's capacitance.

One such used of diodes is illustrated in FIG. 8, which shows an input cell 805. Diodes 800 and 810 are coupled to a node 815. Node 815 is coupled to in input pad 820 and an inverter or buffer 830. An output of inverter 830 is coupled to circuitry of an integrated circuit (not shown) via a lead 840. Diode 800 and inverter 830 are coupled to a power supply (not shown) via a lead 850 to receive $V_{DD}$. Diode 800 is typically a PMOS transistor configured as a diode and diode 810 is typically a NMOS transistor configured as a diode.

When an input signal that is greater than $V_{DD}$ is provided to pad 820, diode 800 is forward biased and conducts to lead 850. Thus, the input signal is prevented from being propagated to the circuitry of the integrated circuit that is coupled to inverter 830.

For most ESD protection schemes, the trigger voltage of the protection device is lower than the break down voltage of the internal circuitry of an integrated circuit. However, these schemes may not work for applications with high input voltages. The high input voltages can be clipped by the ESD protection schemes that, for example, use a parasitic PN diode from input to $V_{DD}$ and a parasitic NP diode from input to ground.

A need exists for an ESD protection configuration that will allow high input signal voltages while shunting ESD voltages. The present invention meets this need.

SUMMARY OF THE INVENTION

The present invention provides for ESD protection while allowing the use of an input signal that is higher than $V_{DD}$. The present invention preferably includes a protection device coupled to an input pad and to a ground reference. The protection device is a preferred silicon controlled rectifier ("SCR"). The present invention also includes a preferred delay circuit also coupled between the input pad and the ground reference. The delay circuit is preferably a low pass filter RC circuit that includes a resistor and a capacitor. A node associated with the delay circuit is coupled to circuitry of an integrated circuit. The integrated circuit circuitry has associated therewith at least one gate oxide breakdown voltage. The present invention preferably is part of the integrated circuit that includes the circuitry.

The present invention prevents a gate oxide breakdown voltage from being applied to the circuitry of the integrated circuit. When an ESD voltage is applied to the input pad, the voltage at that pad ramps or increases quickly. The delay circuit prevents a node voltage from ramping as quickly by delaying the ramping or increasing of the node voltage. This delay provides time for the protection device to turn on and sink the ESD current.

The importance of the delay of the present invention can be understood by way of an example. The trigger voltage of a silicon controlled rectifier can vary (i.e., have a range) due to process variations. In a device that does not incorporate the present invention, the trigger voltage of the SCR must be set at a much lower voltage than the internal gate oxide breakdown voltage to compensate for the possible high-end SCR trigger voltage variations or range. Note that a low SCR trigger voltage will clip a high input signal. However, the present invention compensates for these variations or range by delaying the ramping or increasing of a voltage at an internal node that is coupled to the internal circuitry. As a result, this delay allows the trigger voltage of the SCR to be approximately equal to or greater than the internal gate oxide breakdown voltage since the ramping or increasing of the node voltage is delayed.

The present invention also includes a plurality of other protection devices that are coupled between a power supply and the ground reference. These additional devices provide complete ESD protection for an integrated circuit.

Numerous other advantages and features of the present invention will become readily apparent from the following detailed description of the invention and the embodiments thereof, from the claims and from the accompanying drawings in which details of the invention are fully and completely disclosed as a part of this specification.

BRIEF DESCRIPTION OF THE DRAWINGS

In the drawings,

FIGS. 6A–6F are a cross-section of a silicon controlled rectifier in FIG. 1;

DETAILED DESCRIPTION OF THE PREFERRED EMBODIMENT

Figure 1:
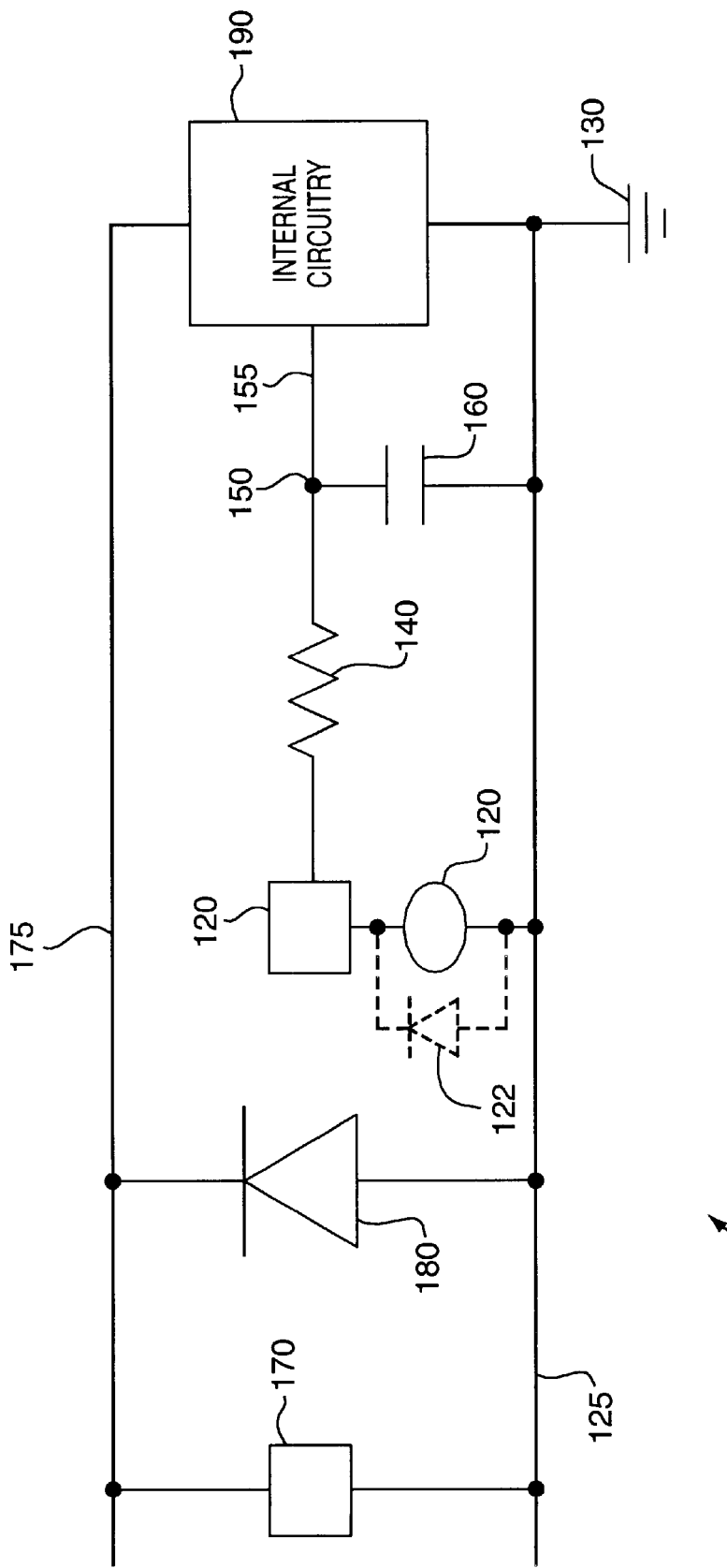
FIG. 1 is a schematic including an embodiment of the present invention.

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

FIG. 1 illustrates an ESD configuration 100 according to the present invention. An input pad 110 is coupled to a first protection device 120, which preferably is a SCR (silicon controlled rectifier). SCR 120 is coupled to a lead 125, which is preferably coupled to a ground potential 130. Also coupled between pad 110 and lead 125 is a parasitic diode 122. Parasitic diode 122 is shown in phantom line to illustrate its existence, although it is part of SCR 120.

Pad 110 is also coupled to a resistive device 140. Resistive device is coupled to a node 150. A capacitive device 160 is also coupled to node 150. A lead 155 couples node 150 to internal circuitry 190. Internal circuitry 190 includes transistors that are included in an integrated circuit, where the transistors have at least one gate oxide breakdown voltage.

A second protection device 170, preferably a thick field device (TFD), is coupled between lead 125 and a lead 175. Lead 175 is preferably connected or coupled to a power supply $V_{DD}$ (not shown), which in this case provides 5V. A third protection device 180 is coupled between leads 125 and 175. The third semiconductor device 180 preferably is a parasitic diode with its anode coupled to lead 125 and its cathode coupled to lead 175.

SCR 120 turns on during an ESD event to protect the circuitry connected to lead 155. Resistive device 140 and capacitive device 160 form a low pass filter RC circuit that delays the application of the increasing ESD voltage to the circuitry connected to lead 155. The delay provides time for SCR 120 to turn on or activate before the gate oxide breakdown voltage of the circuitry is reached at node 150. As a result, the voltage at node 150 never reaches the gate oxide breakdown voltage of the circuitry connected to lead 155.

To prevent clipping of an operating input signal that is applied to pad 110, the trigger voltage of SCR 120 is preferably greater than the input signal voltage. To illustrate, if the input signal is about 10V, then the trigger voltage is about 14V. Furthermore, resistive device 140 and capacitive device 160 preferably can handle a voltage greater than or equal to the trigger voltage of SCR 120.

According to the MIL 883C Method 3015.7 HBM model, all pins are ESD tested in four combinations as described in the following. To also illustrate, when a positive ESD voltage is applied between pad 110 and lead 175, SCR 120 and diode 180 turn on to conduct ESD current from pad 110 to lead 175. When a negative ESD voltage is applied between pad 110 and lead 175. TFD 170 and parasitic diode 122 turn on to conduct ESD current from lead 175 to pad 110. A positive ESD voltage between pad 110 and lead 125 turns on SCR 120 to conduct ESD current from pad 110 to lead 125. A negative ESD voltage between pad 110 and lead 125 turns on parasitic diode 122 to conduct ESD current to pad 110 from lead 125.

The low pass filter RC circuit is provided to delay the ESD voltage long enough so that SCR 120 turns on to sink the ESD current. The delay prevents a voltage at node 150 from reaching the gate oxide breakdown voltage before SCR 120 turns on. For example, SCR 120 can turn on in 1 ns. Thus, the RC circuit delay should prevent the voltage at node 150 from reaching the gate oxide breakdown voltage within that 1 ns. Depending on the amount of RC circuit delay, the trigger voltage for SCR 120 can be greater than the gate oxide breakdown voltage. That being the case, there is a positive correlation between the magnitudes of the RC circuit delay and the trigger voltage for SCR 120.

Figure 2:
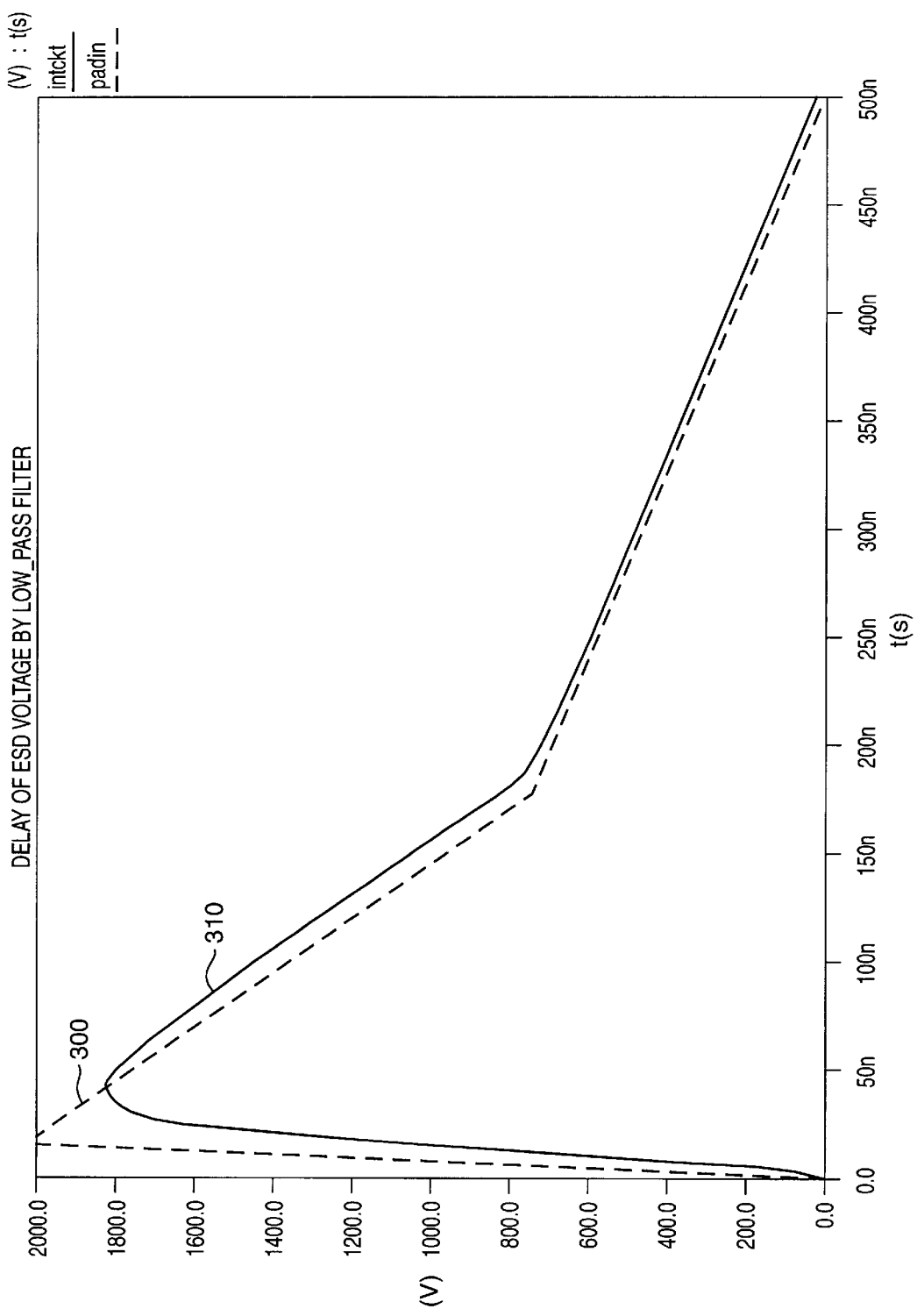
FIG. 2 is a graph of the ESD delay for the FIG. 1 low pass filter.

The graph of FIG. 2 shows the voltages at pad 110 and node 150 during a simulated ESD event that provides a voltage>2000V for R=1 k ohm and C=10 pF. As shown by line 300, the voltage at pad 110 ramps quickly. The voltage on pad 110 rises to 90% of the ESD voltage test level within 15 ns. Line 310 indicates that the voltage at node 150 is delayed from the voltage of pad 110.

Figure 3:
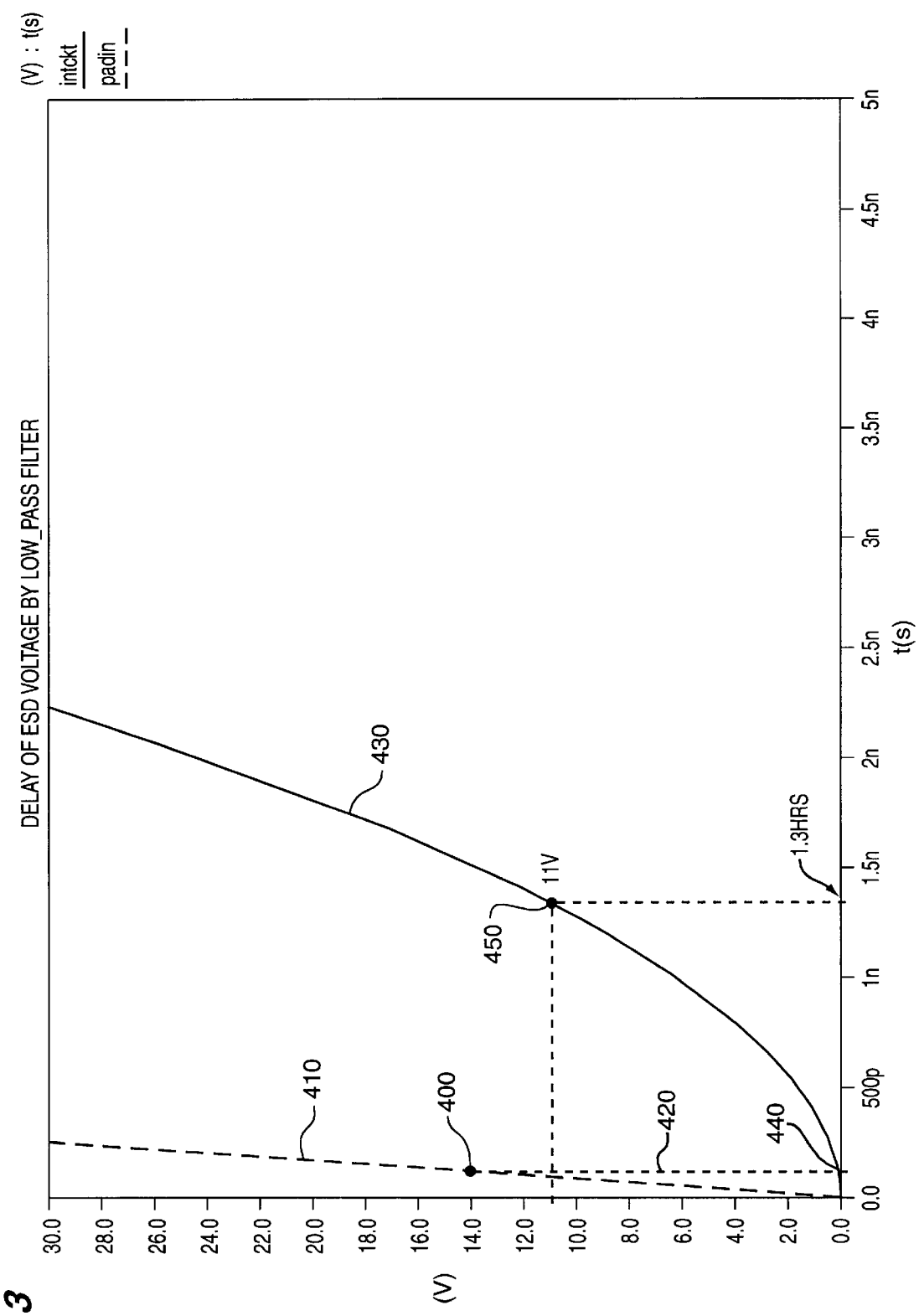
FIG. 3 is a graph showing increased voltage/time resolution of the FIG. 2 graph.

Referring to FIG. 3 for more detail, a point 400 on a line 410 represents the trigger voltage for SCR 120. Line 410 represents the simulated ESD event voltage at pad 110. A line 420 that is perpendicular to the x-axis and intersects line 410 at point 400 also intersects a line 430 at a point 440. Line 430 represents the increasing voltage of node 150. Point 440 represents the voltage of node 150, which is<1V. Node 150 will reach the gate oxide breakdown voltage, illustrated as 11V at a point 450, after approximately 1.3 ns. As can be seen from the FIG. 3 graph, the RC delay will prevent node 150 from reaching the gate oxide breakdown voltage before SCR 120 triggers, since SCR 120 can trigger within 1 ns. Node 150 will not reach the trigger voltage of SCR 120 since the voltage at pad 110 will decrease after SCR 120 activates due to properties of SCR 120. Thus, the gate oxide breakdown voltage will not be applied to circuitry coupled to node 150 since SCR 120 activates and sinks all the current from an ESD event.

Figure 4:
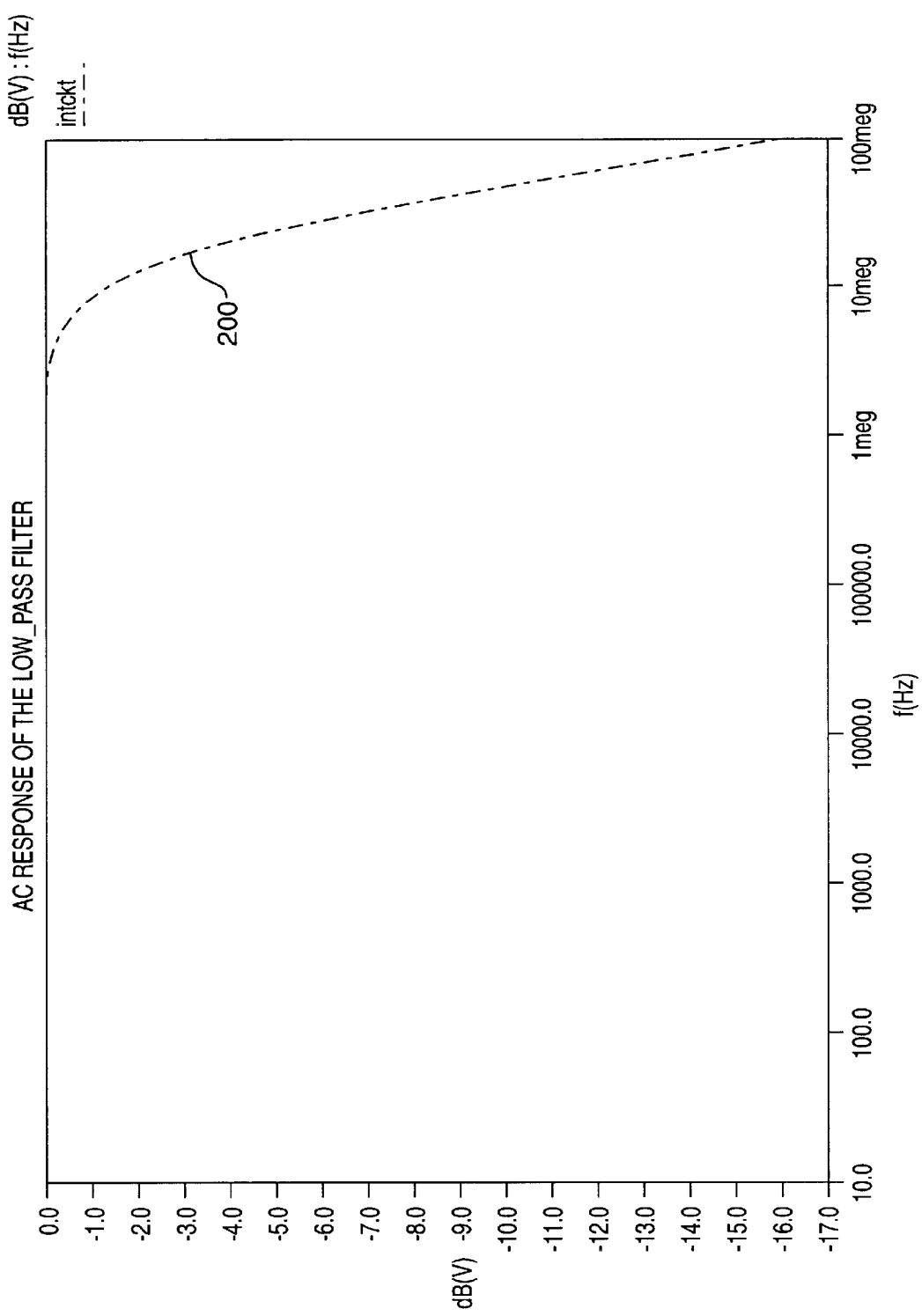
FIG. 4 is a graph of the AC response for the FIG. 1 low pass filter.

FIG. 4 is a graph that shows the attenuation of a voltage at node 150 due to the effects of the RC circuit. For this graph, the values for resistive device 140 and capacitive device 160 are 1 K ohms and 10 pF, respectively. As illustrated by line 200, the attenuation of a 1 Mhz signal at node 150 is less than 0.017 dB. The attenuation of a 10 MHz signal is less than 1.5 dB. This attenuation is not significant for most applications. Preferably, resistive device 140 is made of polysilicon and capacitive device 160 is made of double polysilicon. Devices 140, 160 should be able to electrically operate with the SCR trigger voltage.

Although specific values for resistive device 140 and capacitive device 160 have been disclosed, different values can be used to provide a range of delays. A RC delay should be greater than the time required for the SCR to activate. Increasing the RC value, and hence the delay, will aid the ESD protection at the expense of decreasing the frequency bandwidth of pad 110. Also, the value of the resistive device 140 can be increased to decrease the value of capacitive device 160 for the same RC delay. As a result, the area of pad 110 would be decreased.

FIGS. 5A–E are cross sections of an integrated circuit at various stages of fabrication showing a process for making the preferred thick field device 170 in FIG. 1. Three devices are shown: a silicon controlled rectifier (SCR), a thick field device (TFD) and an NMOS transistor (NMOS).

Figure 5A:
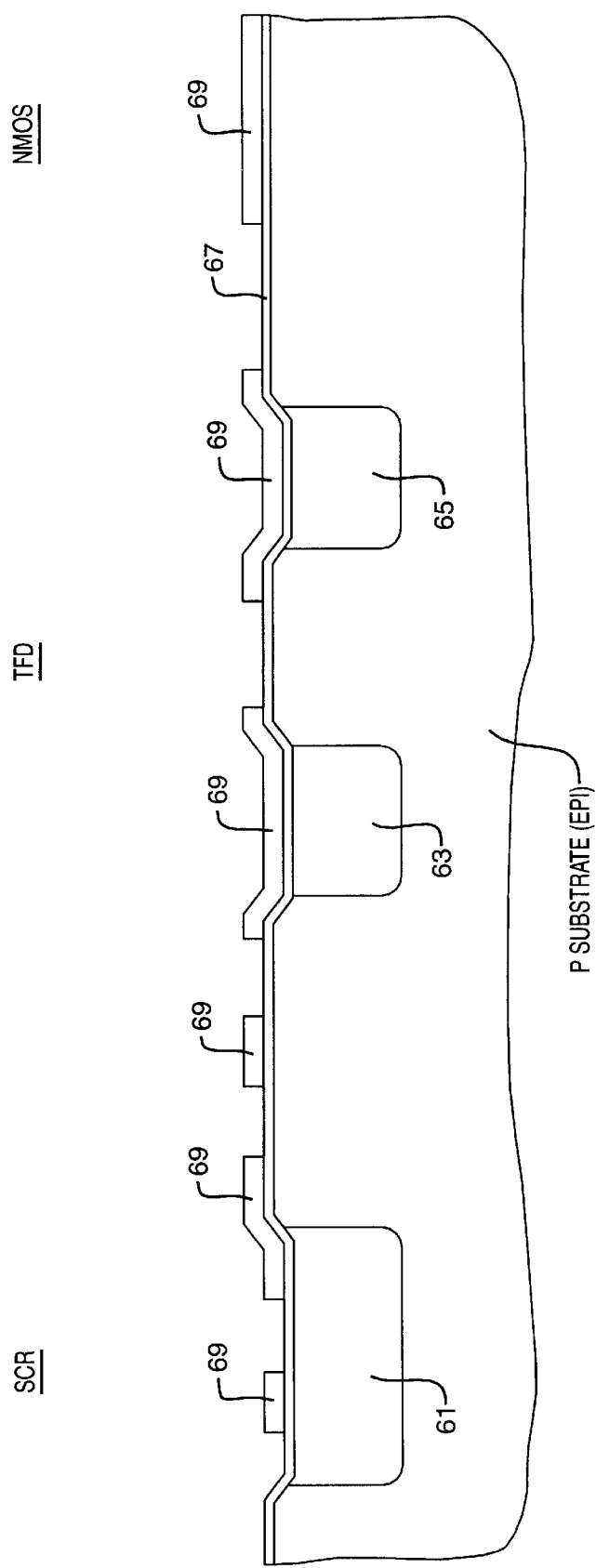
FIGS. 5A–5E are a cross-section of a thick field device in FIG. 1.

As seen from FIG. 5A, the devices are formed in a P-substrate, epitaxial wafer with an intrinsic dopant concentration of about 1E16/cm3. A single N well 61 is formed for the SCR, while twin wells 63 and 65 are formed using a "twin tub process" for the thick field device. N wells are formed by implanting N-type dopant to achieve a concentration of about 1E16 to 1E17/cm3 to a depth of about two microns. A thin (e.g., 300 angstrom) oxide layer 67 is then formed over all areas, followed by a thicker (1600 angstrom) nitride layer 69. The nitride is masked and etched to expose active regions for SCR, TFD and NMOS devices.

Figure 5B:
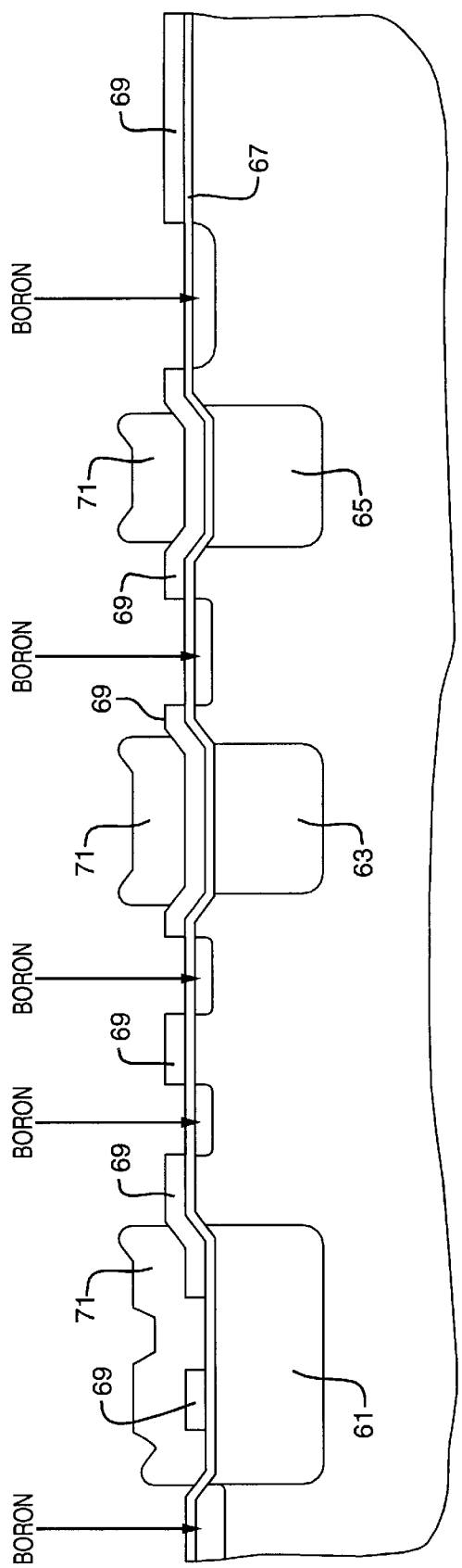
Figure 5C:
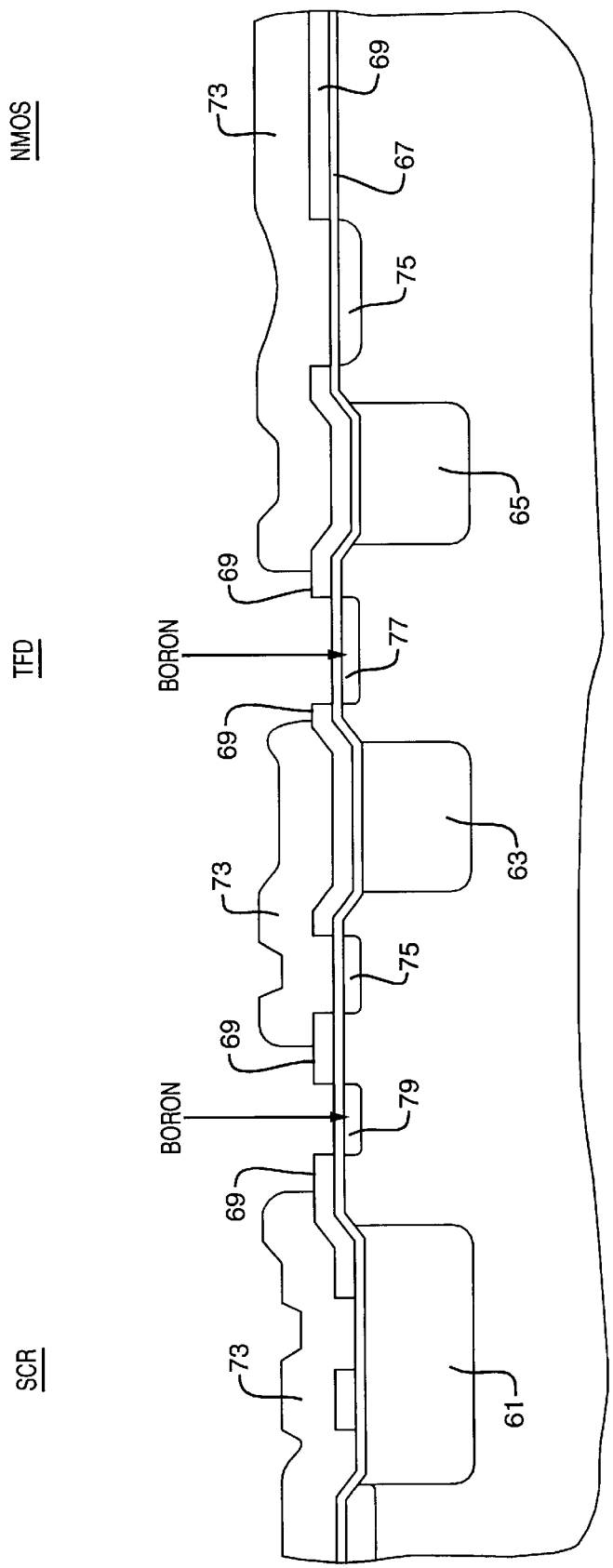

As seen from FIG. 5B, a photoresist mask layer 71 is applied and patterned to expose substrate regions which will receive a 30 keV boron implant to bring dopant concentration up to about 3E13/cm2. As seen from FIG. 5C, a second photoresist mask is applied and patterned to expose selective regions of the SCR and the TFD for an additional boron implant at about 40 keV to bring dopant concentration up to about 1.7E14/cm2. Considerations affecting this implant for the SCR can be found in U.S. patent application Ser. No. 08/129,224, entitled "Field Implant for Silicon Controlled Rectifier" incorporated herein by reference. After this second implant, most field regions 75 will have a first, lower boron concentration, while the SCR and TFD will have specific regions 77,79 with higher concentrations. The purpose and operation of these higher concentrations will be discussed more fully below.

Figure 5D:
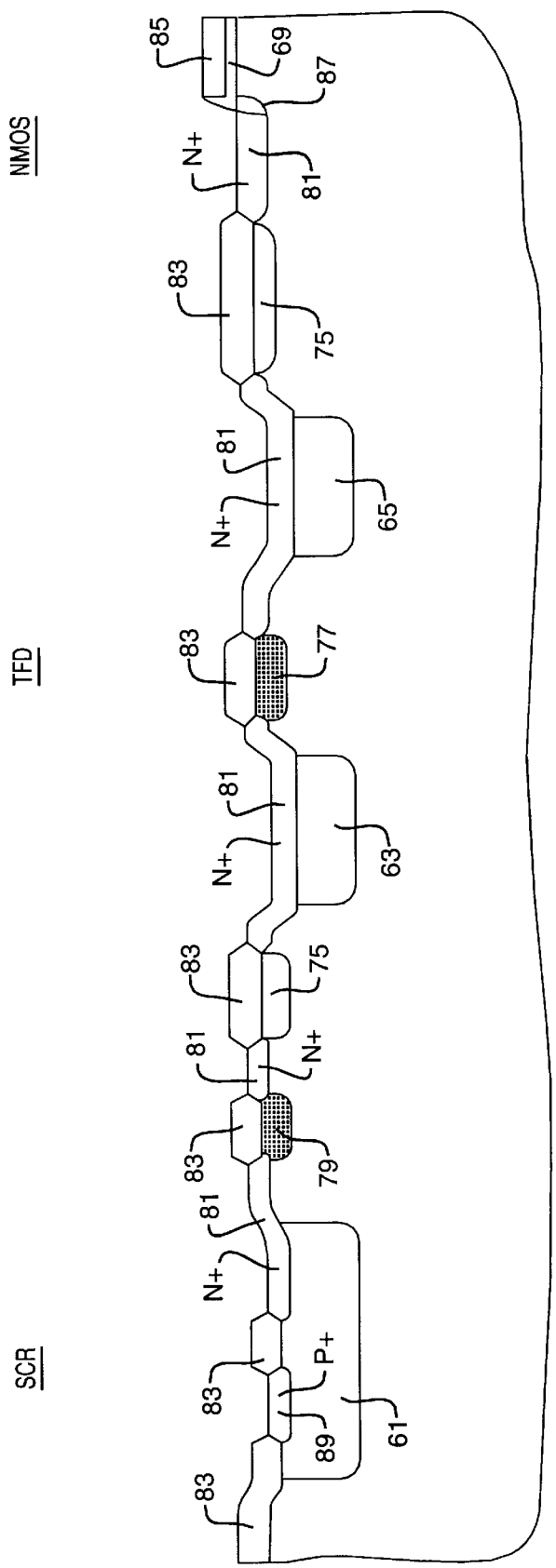

As seen from FIG. 5D, field oxides are then grown 83 to thicknesses of about 5000 angstroms, and poly-crystalline gate contacts are formed 85. Additional mask and implant steps are carried out to form active N+ regions 81 to a depth of about 0.25 microns, and active P+ regions 89 to a depth of about 0.3 microns. Optionally, the process steps can be adjusted to provide lightly doped drain regions 87 using a sidewall spacer technique.

Figure 5E:
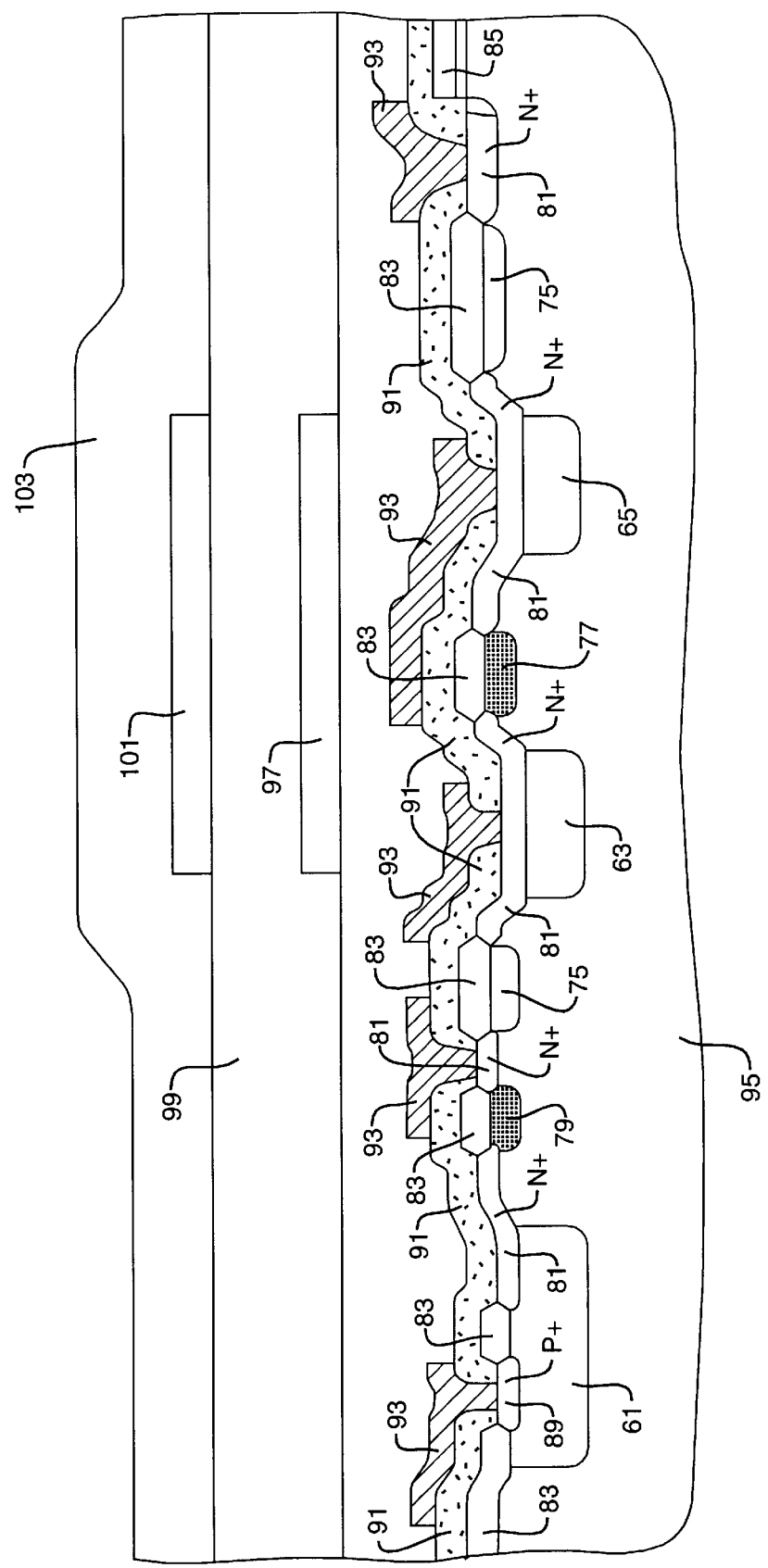

As seen from FIG. 5E, a layer 91 of borophososilicate glass (BPSG) is deposited, through which holes are etched for metal contacts to a first metal layer 93. A first interlayer dielectric 95 is applied and followed by a second metal layer 97. A second interlayer dielectric 99 is applied, followed by a second metal layer 101 and a passivation layer 103.

The thick field device is an NPN transistor with a floating gate. It is desirable to adjust the trigger voltage of the thick field device so that its turn-on voltage is about 80% of the voltage (e.g., gate oxide breakdown voltage) at which other devices on the integrated circuit become damaged. The trigger voltage is adjusted by controlling the field implant dopant concentration in a field implant region 79 (FIG. 5E) under the field oxide.

The effect of the field implant can be appreciated once it is recognized that the junction breakdown voltage of a semiconductor diode is an inverse function of the dopant concentration in the diode. Junction breakdown is the trigger mechanism for the thick field device. Thus, increasing concentration under the field oxide reduces trigger voltage. This is accomplished in the second boron implant, shown in FIG. 5C for TFD region 79. (A lower concentration field implant is used elsewhere to prevent field inversion.)

Figure 6A:
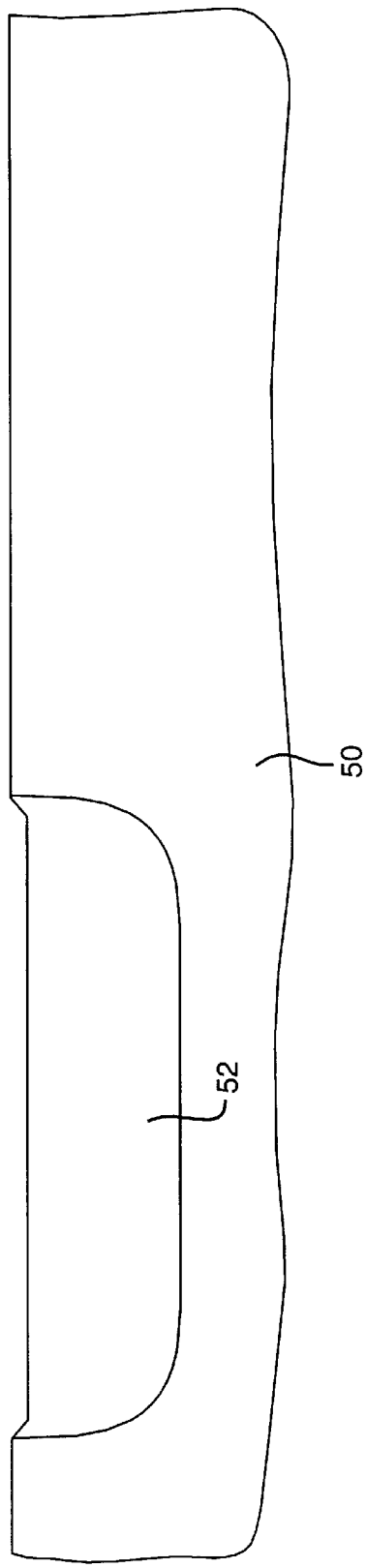

FIGS. 6A–6F illustrate cross sections of the preferred SCR 120 shown in FIG. 1 at various points in the fabrication process. FIG. 6A illustrates a wafer having a p substrate 50 in which an n-well 52 has been formed. The wafer may be a five micron epitaxial layer doped to a concentration of about 2E15/cm$^3$. The epitaxial layer is formed over a lower layer (not shown) that is intrinsically doped at a concentration of approximately 1E19/cm$^3$.

Figure 6B:
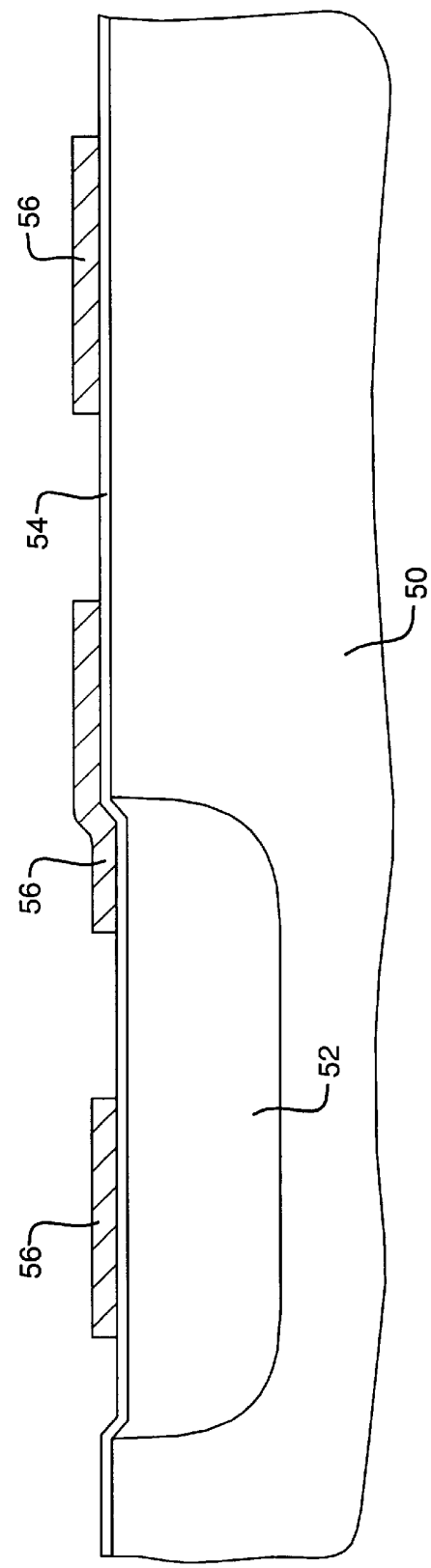

In FIG. 6B, a thin oxide layer 54 has been formed over both the substrate 50 and the well 52, and a nitride pattern 56 has been formed in a pattern over the oxide layer 54. The nitride pattern 56 leaves exposed areas which will ultimately become field oxides.

Figure 6C:
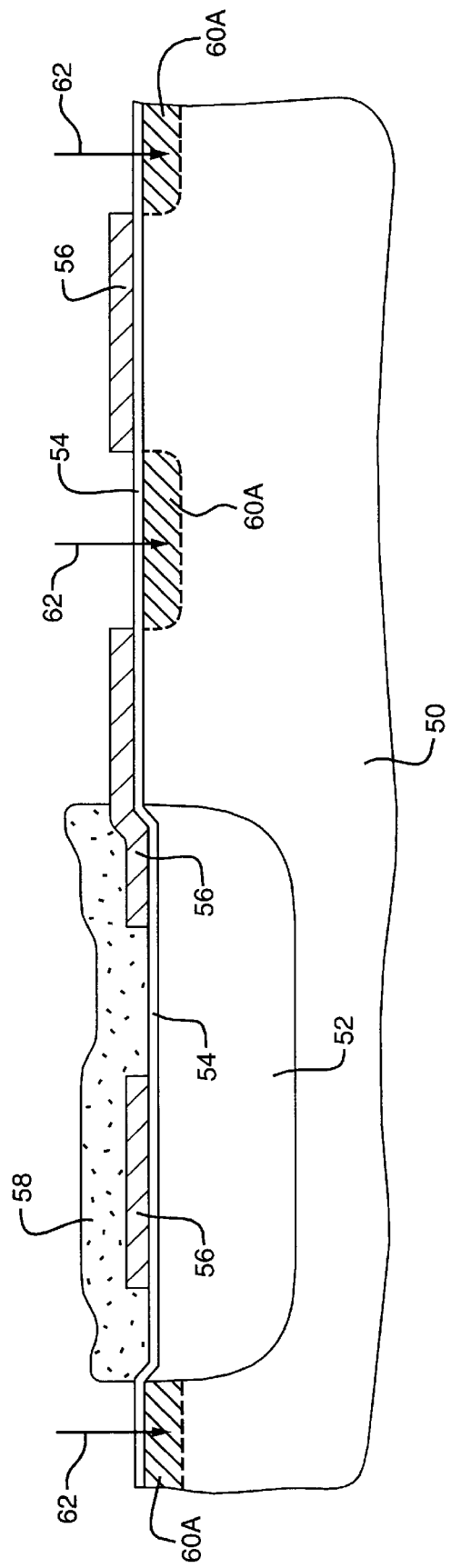

In FIG. 6C, a photo-resist mask 58 has been applied and patterned to cover the n-well, leaving exposed region 60a that will receive a boron implant 62. Region 60a is located adjacent to n-wells and isolate devices formed within individual wells. This is a traditional field implant used to prevent field inversion. It is contemplated that this step will implant boron to a concentration of about 3×10E13/cm2 at an implant energy of about 40 KeV. This is a dose for a typical implant to prevent field inversion, and may be omitted when design rules permit.

In FIG. 6D, field oxides 70 are formed in regions previously exposed by the nitride pattern 56. In order to grow such field oxides, the second mask pattern has been removed and the substrate exposed to an oxidizing atmosphere. Then, the nitride layer and the thin oxide layer are removed.

Figure 6F:
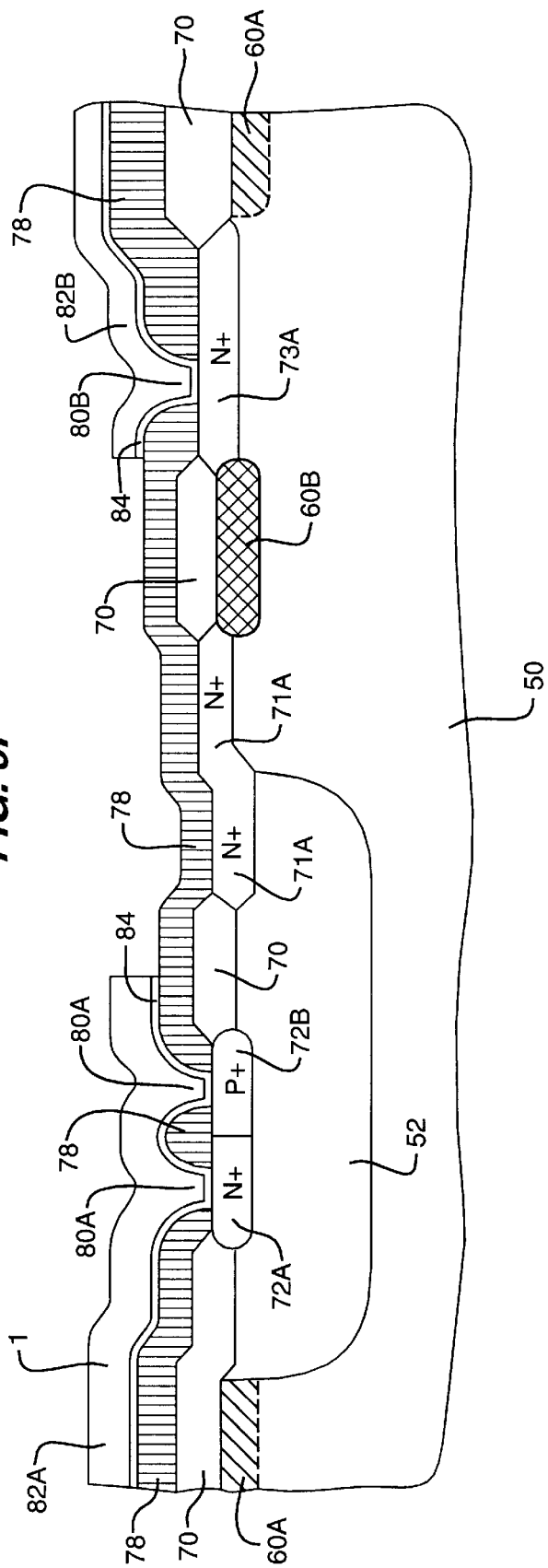

In FIG. 6E, n+ and p+ dopants have been selectively implanted to form active n+ regions 72a and active p+ regions 72b. This active n+ region extends past the end of the n-well into the p-well, thus correct junction bypassing is maintained. The n+ region acts as a low resistance path from the base of the vertical PNP into the emitter of the lateral NPN. In FIG. 6F, a borophosphosilicate glass (BPSG) layer 78 has been formed over the entire wafer, and contact holes have been formed into selected contact regions—one for a contact pad 80a and another for Vss 80b. A metal pad 82a and a metal interconnect line 82b of aluminum/silicon/copper is formed above the BPSG 78. In the contact holes 80, a titanium nitride barrier layer 84 is also formed. The metal interconnect line 82b is in turn connected to Vss.

The SCR is made up of the following four regions: 1) the p+ region 72b and the n+ region 72a in the n-well 52, 2) the n-well itself 52, 3) the p substrate 50, and 4) the n+ region 73a in the p substrate 50 that is connected to metal interconnect line 80b. The n-well contains both an active n+ and an active p+ region connected to the contact pad 80a. The p+ region 72b acts as a connection to the SCR, while the n+ region 72a acts as an ohmic contact for n-well 52.

The structure of parasitic diode 122 of FIG. 1 will be explained with reference to FIG. 6F. The junction between p-substrate 50 and n-well 52 forms the basic parasitic diode structure. N-well 52 is coupled to a lead via ohmic contact region 72a. Specifically, region 72a would be coupled to pad 110 of FIG. 1. An ohmic contact p-region is disposed either adjacent to region 73a or adjacent to region 70 of FIG. 6F. This p-region is connected to a lead, such as lead 125 shown in FIG. 1. When a positive ESD voltage is applied between lead 125 and pad 110, current is conducted through the p-region, p-substrate 50, n-well 52 and region 72a to pad 110.

Figure 7:
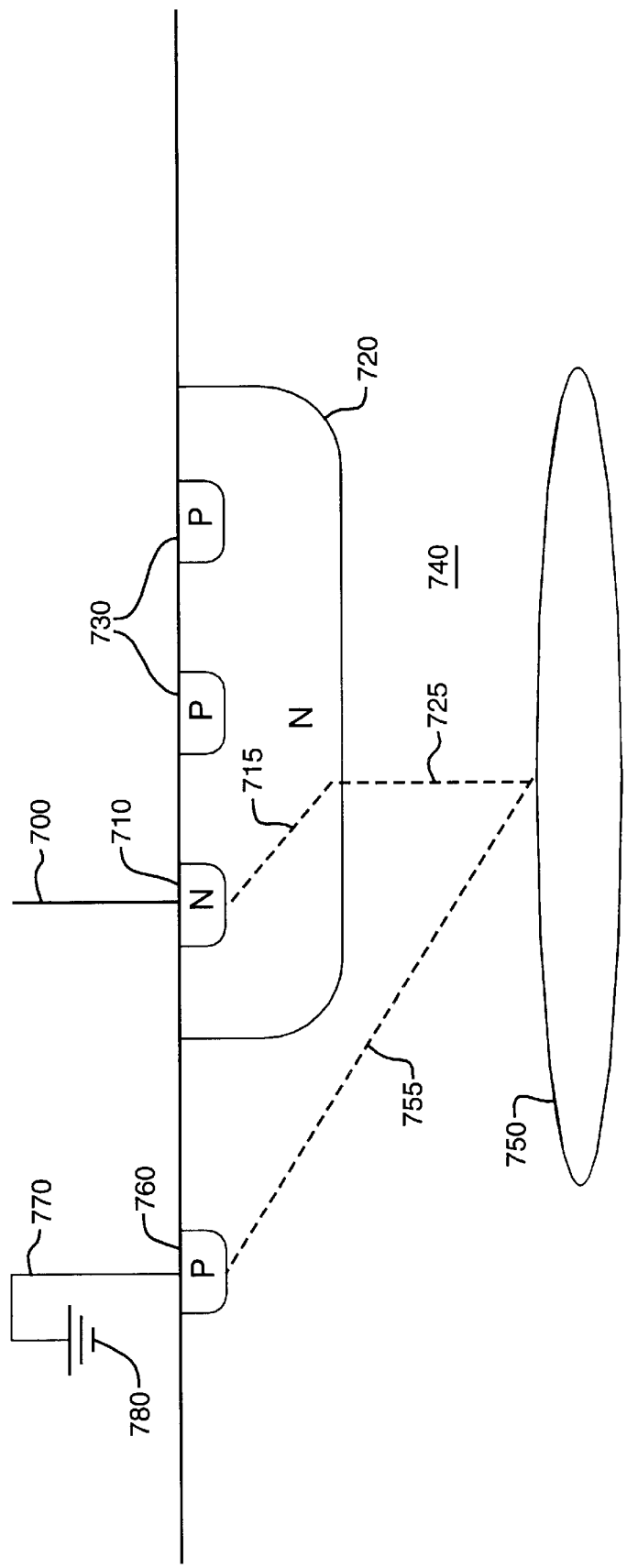
FIG. 7 is a cross-section showing a parasitic diode of FIG. 1.
Figure 8:
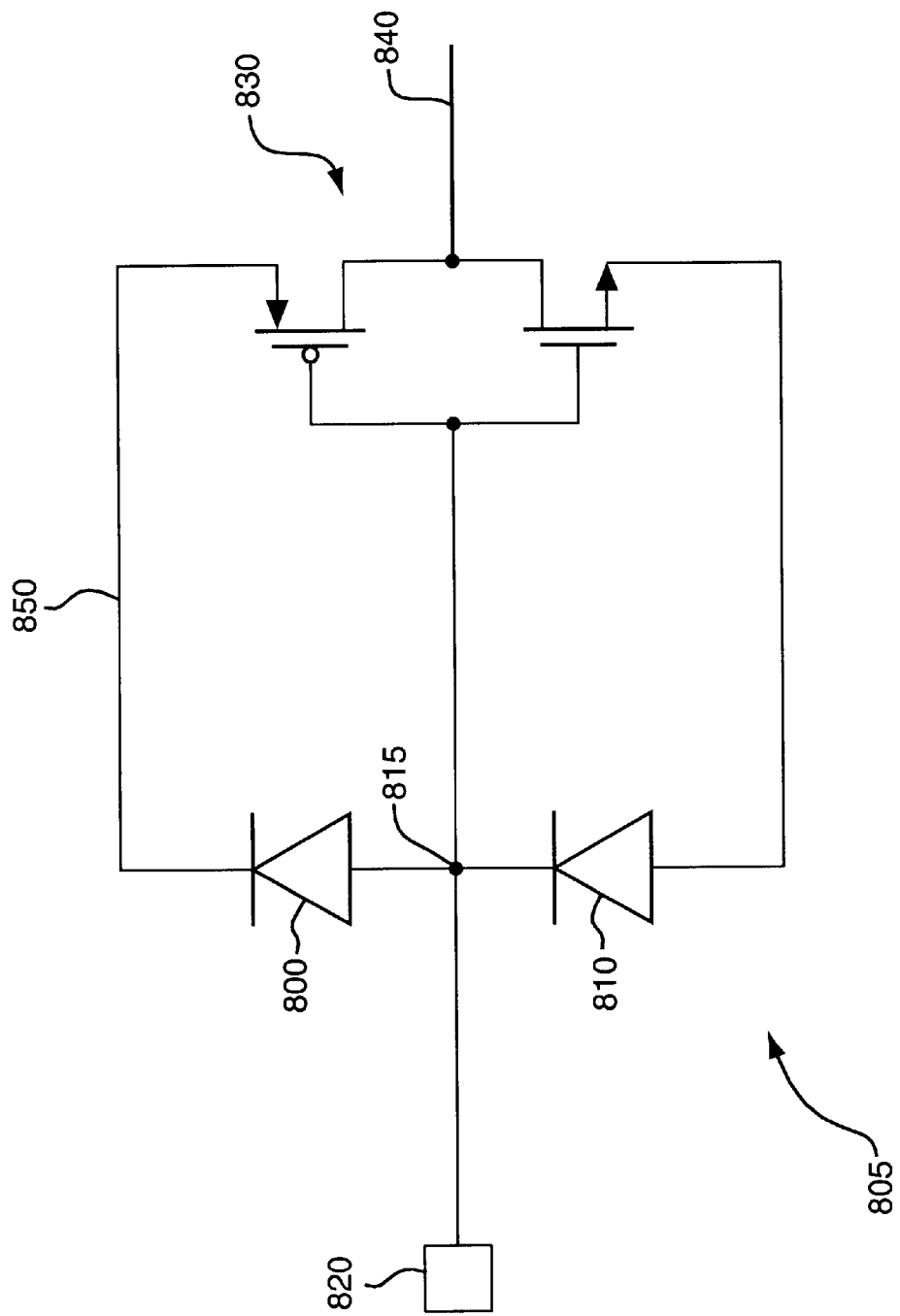
FIG. 8 is a schematic including an input cell.

FIG. 7 is a cross-section exemplifying parasitic diode 180 of FIG. 1. A lead 700 is coupled at one end to a power supply (not shown) such as $V_{DD}$. The other end of lead 700 is coupled to a n-type diffusion region 710. Diffusion region 710 is disposed in a n-type well 720. Region 710 is an ohmic connection between lead 700 and well 720. Also shown disposed in well 720 are p-type regions 730. Typically, regions 730 and well 720 would form a p-type CMOS transistor.

Well 720 is diffused in a substrate 740, typically of a p-type material. Below substrate 740 is a epitaxial layer 750. Disposed in substrate 740 is a p-type diffusion region 760. Connected to region 760 is a lead 770 that is connected to a ground 780. Region 760 is an ohmic contact between substrate 740 and lead 770.

A parasitic diode, such as diode 180 shown in FIG. 1, is formed at a junction of well 720 and substrate 740. Dashed lines 715, 725 and 755 represent an electrical conduction path between $V_{DD}$ and ground. Such a path is schematically shown in FIG. 1 between leads 125 and 175 through diode 180.

1. Numerous variations and modifications of the embodiment described above may be effected without departing from the spirit and scope of the novel features of the invention. It is to be understood that no limitations with respect to the specific device illustrated herein are intended or should be inferred. It is, of course, intended to cover by the appended claims all such modifications as fall within the scope of the claims.

We claim:

1. A method of preventing gate oxide breakdown from a ESD event of an integrated circuit comprising the step of delaying an increasing of a node voltage during the ESD event to allow a protection device to activate, wherein the node voltage is applied to the integrated circuit.

2. The method of claim 1 wherein the step of delaying utilizes a delay circuit.

3. The method of claim 1 wherein the protection device activates to sink an ESD current before the node voltage becomes a gate oxide breakdown voltage.

4. The method of claim 1 wherein the protection device is a silicon controlled rectifier.

5. The method of claim 1 wherein the delay circuit and the protection device are coupled to an input pad.

6. A gate oxide breakdown from an ESD event prevention circuit comprising:
a delay circuit having an associated node, the delay circuit being coupled to a pad to delay an increasing of a node voltage during the ESD event; and
a protection device coupled to the pad and that activates before the node voltage is a gate oxide breakdown voltage, wherein the node voltage is applied to the integrated circuit and the node voltage is delayed to allow the protection device to activate.

7. The circuit of claim 6 wherein the delay circuit and the protection device are coupled to a reference voltage.

8. The circuit of claim 6 wherein the delay circuit is a RC circuit.

9. The circuit of claim 8 wherein the RC circuit is a low pass filter.

10. The circuit of claim 6 wherein the protection device is a silicon controlled rectifier.

11. The circuit of claim 6 further including protection devices coupled between a power supply and the reference voltage.

12. The circuit of claim 11 wherein the protection devices include a thick field device and a diode.

13. A method of compensating for variations in a trigger voltage for a protection device from an ESD event comprising the step of delaying an increasing of a node voltage during the ESD until the protection device activates, wherein the node voltage is applied to the integrated circuit.

14. The method of claim 13 further comprising the step of providing a delay circuit that includes an associated node.

* * * * *